(12) United States Patent
Chen et al.

(10) Patent No.: US 9,916,695 B2
(45) Date of Patent: Mar. 13, 2018

(54) STRUCTURE SELF-ADAPTIVE 3D MODEL EDITING METHOD

(71) Applicant: BEIHANG UNIVERSITY, Beijing (CN)

(72) Inventors: Xiaowu Chen, Beijing (CN); Qiang Fu, Beijing (CN); Qinping Zhao, Beijing (CN); Xiaoyu Su, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 0 days.

(21) Appl. No.: 15/405,208

(22) Filed: Jan. 12, 2017

(65) Prior Publication Data
US 2017/0221274 A1 Aug. 3, 2017

(30) Foreign Application Priority Data
Jan. 28, 2016 (CN) .......................... 2016 1 0059039

(51) Int. Cl.
| | |
|---|---|
| *G06T 17/00* | (2006.01) |
| *G06T 19/20* | (2011.01) |
| *G06T 15/00* | (2011.01) |
| *G06T 17/10* | (2006.01) |
| *G06F 17/50* | (2006.01) |

(52) U.S. Cl.
CPC .............. *G06T 19/20* (2013.01); *G06F 17/50* (2013.01); *G06T 15/005* (2013.01); *G06T 17/10* (2013.01); *G06T 2200/04* (2013.01); *G06T 2219/2016* (2013.01); *G06T 2219/2021* (2013.01)

(58) Field of Classification Search
None
See application file for complete search history.

(56) References Cited

U.S. PATENT DOCUMENTS

2009/0079736 A1* 3/2009 Nakao .................... G06T 15/08
345/424

OTHER PUBLICATIONS

Siddhartha Caudhuri et al., "Probabilistic Reasoning for Assembly-Based 3D Modeling" Journal—ACM Transactions on Graphics (TOG)—Proceedings of ACM SIGGRAPH 2011; vol. 30 Issue 4; (Jul. 2011); Article No. 35.
(Continued)

*Primary Examiner* — Martin Mushambo
(74) *Attorney, Agent, or Firm* — J.C. Patents (57) ABSTRACT

The invention provides a structure self-adaptive 3D model editing method, which includes: given a 3D model library, clustering 3D models of same category according to structures; learning a design knowledge prior between components of 3D models in same group; learning a structure switching rule between 3D models in different groups; after user edits a 3D model component, determining a final group of the model according to inter-group design knowledge prior, and editing other components of the model according to intra-group design knowledge prior, so that the model as a whole satisfies design knowledge priors of a category of 3D models. Through editing few components by the user, other components of the model can be optimized automatically and the edited 3D model satisfying prior designs of the model library can be obtained. The invention can be applied to fields of 3D model editing and constructing, computer aided design etc.

5 Claims, 3 Drawing Sheets (56) References Cited

OTHER PUBLICATIONS

Thomas Funkhouser et al., "Modeling by Example" Journal—ACM Transactions on Graphics (Proc. SIGGRAPH), Aug. 2004; vol. 23 Issue 3, (Aug. 2004); pp. 652-663.
Chongyang Ma et al., "Analogy-Driven 3D Style Transfer" Journal—Computer Graphics Forum ; Eurographics; vol. 33, No. 2; (2014).
Alec Rivers et al., "3D Modeling with Silhouettes" Journal—ACM Transactions on Graphics (TOG)—Proceedings of ACM SIGGRAPH 2010; vol. 29 Issue 4, (Jul. 2010); Article No. 109.
Robert W. Summer et al., "Deformation Transfer for triangle Meshes" Journal—ACM Transactions on Graphics (TOG)—Proceedings of ACM SIGGRAPH 2004; vol. 23 Issue 3, (Aug. 2004); pp. 399-405.
Kai Xu et al., "Style-Content Separation by Anisotropic Part Scales" Journal—ACM Transactions on Graphics (TOG)—Proceedings of ACM SIGGRAPH Asia 2010; vol. 29 Issue 6, (Dec. 2010); Article No. 184.
Kai Wu et al., "Photo-Inspired Model-Driven 3D Object Modeling" Journal—ACM Transactions on Graphics (TOG)—Proceedings of ACM SIGGRAPH 2011; vol. 30 Issue 4, (Jul. 2011); Article No. 80.
Mehmet Ersin Yumer et al., "Co-Constrained Handles for Deformation in Shape Collections" Journal—ACM Transactions on Graphics (TOG)—Proceedings of ACM SIGGRAPH Asia 2014; vol. 33 Issue 6, (Nov. 2014); Article No. 187.
Youyi Zheng et al., "Smart Variations: Functional Substructures for Part Compatibility" Journal—Computer Graphics Forum ; Eurographics; vol. 32, No. 2, (2013).

* cited by examiner

STRUCTURE SELF-ADAPTIVE 3D MODEL EDITING METHOD

CROSS-REFERENCE TO RELATED APPLICATIONS

This application claims priority to Chinese Patent Application No. 201610059039.X, filed on Jan. 28, 2016 and entitled "STRUCTURE SELF-ADAPTIVE 3D MODEL EDITING METHOD", which is hereby incorporated by reference in its entirety.

TECHNICAL FIELD

The present invention belongs to the field of 3D geometry editing technologies and, particularly, to a structure self-adaptive 3D model editing method.

BACKGROUND

With the development of three-dimensional (3D) modeling technologies and abundance of the model resources, personalized 3D model editing has attracted more and more attention, how to speed up the degree of automation of the 3D model editing procedure is one of the research hotspots. However, due to the huge differences between different 3D model structures and the disunity of the model sizes, automation of 3D model editing turns to be a difficult problem.

In order to resolve the problem, a 3D model library is introduced as a guide. By compiling statistics of the design knowledge priors of the models in the 3D model library, the degree of automation of the 3D model editing procedure can be improved. There are plenty of literatures about 3D model editing in the field of computer graphics, without enumerating all the methods, reconstructing and editing of 3D models and related works will be the focus, as well as the combination constructing of the 3D models.

According to different sources of guiding information, the 3D model editing methods can be categorized into three types: guiding the 3D model editing procedure using the learned design knowledge prior of the model library; reducing the complexity of the 3D model editing procedure by using two-dimensional (2D) model information to guide the deformation of 3D models; a 3D model editing method based on analogy, which constructs a procedure tree referring to the variations during the procedure, and applies the procedure tree self-adaptively to the input model. In 2012, Mehmet Ersin Yumer et al from Carnegie Mellon University proposed a method which uses model library priors to edit 3D models. In 2010, Kai Xu et al from Simon Fraser University proposed a method of model style migration based on mutual analysis, where the method obtains the correlations between model components by analyzing the geometrical characteristics of the components in the 3D model library. In 2010, Alee Rivers et al from Massachusetts Institute of Technology proposed a method for 3D modeling based on 2D contour line, which uses the analytical result of the line rule to guide the deformation and combination constructing of the 3D model elements. In 2011, Kai Xu et al from National University of Defense Technology proposed a method for editing and generating 3D modeling guided by 2D images; by analyzing the design rule of 2D images, the rule is migrated to 3D models and 3D models that fit the image style are generated. In 2004, Robert W. Summe et al from Massachusetts Institute of Technology proposed a method of deformation migrating of 3D models based on 3D meshes, where the deformation migrating procedure based on meshes includes three steps: first, a user is needed to assign a corresponding relationship between the triangular patch of source model and the target model, then migrating the variation of the triangular patch of the source model directly to the target model, finally, adjusting the positions of other patches by solving constrained optimization. In 2014, Chongyang Ma et al from Columbia University proposed model deformation based on analogy. The method obtains the analogy relationship between the source model and the target model and applies the analogy relationship to an example model, and then obtains the deformation migrated 3D model.

There are plenty of researches about the reconstructing and editing methods of 3D models. In 2004, Thomas Funkhouse et al from Princeton University published the first paper about using high level information for 3D modeling, the method uses existing library models to combine and generate new 3D models. In 2011, Siddhartha Chaudhuri et al from Stanford University proposed a model combination method based on bayesian network learning. In 2011, Kai Xu et al from National University of Defense Technology proposed a 3D modeling method guided by images; by analyzing the design rule of 2D image models, the rule is migrated to 3D models and 3D model results that fit the image style are generated. In 2013, Youyi Zheng et al from King Abdullah University of Science and Technology proposed a new model combination based on functions. The method inputs two or more segmented models, and obtains a large amount of 3D models by substituting the symmetric functional sub-structure of respective models.

SUMMARY

The purpose of the present invention is to provide a structure self-adaptive 3D model editing method. In order to fulfill the purpose of the present invention, the technical solutions are as follows: first, clustering 3D models of the same category in a model library into different structure groups using clustering algorism, where models in the same group have the same structures; then, learning an intra-group design knowledge prior and an inter-group design knowledge prior to guide the editing and generating of the models; finally, generating new models via user's interactions, applying the learned design knowledge priors to self-adaptive 3D model editing procedure, and obtaining new 3D models that fit the design knowledge priors.

The technical solutions of the present invention are described in the following. A structure self-adaptive 3D model editing method is provided, which includes:

step S100, clustering 3D models of a same category according to structures: inputting 3D models of the same category, clustering the 3D models into different groups according to difference in components contained in the 3D models, where structures of models in the same group are required to be as similar as possible and structures of models between different groups are required to be as different as possible;

step S200, learning a design knowledge prior of intra-group 3D models: compiling statistics of relationships between the components of models in the same group using a multivariate linear regression model according to a result of the clustering of the 3D models of the same category, to guide a 3D model editing procedure with structures thereof being preserved;

step S300, learning a structure switching rule of inter-group 3D models: analyzing geometrical parameter distribution of common components of the models in different groups according to the result of the clustering of the 3D models of the same category, and obtaining the structure switching rule of inter-group 3D models; and step S400, optimizing a user-edited 3D model: editing, by a user using an interactive tool, a size, a position, and/or an angle parameter of a component of a 3D model, adjusting a structure of the user-edited 3D model and automatically optimizing geometrical parameters of other components of the user-edited 3D model according to the learned intra-group design knowledge prior and the inter-group structure switching rule of the 3D models so that the optimized 3D model satisfies the design knowledge prior of a model library, the structure self-adaptive 3D model editing method can be used to increase the 3D model editing speed and improve degree of automation of the model editing.

The clustering 3D models of a same category according to structures in step S100 includes:

step S110, normalizing the sizes and positions of the 3D models in the model library, and pre-dividing the models in the model library into a component level, where the method does not require a semantic corresponding relationship between components of different models, the corresponding relationship between components of different models is obtained automatically by clustering the components according to the position relationship between the components;

step S120, after clustering the 3D model components, determining the quantity N of the component types in the models of the same category and defining a set of the components as $\{P_1, P_2, \ldots, P_N\}$, for the model $S_i$ in the 3D model library, a vector $x_i$ containing N elements can be obtained, if model $S_i$ contains a component $P_n$, then $x_i(n)=1$, otherwise, $x_i(n)=0$, given any two 3D models $S_i$ and $S_j$, vectors $x_i$ and $x_j$ can be obtained, where the distance ( ) between the two vectors can be defined as:

$$(x_i, x_j) = \sum_{(n_1, n_2)} x_i(n_1)(1\ x_j(n_1))(1\ x_i(n_2))x_j(n_{21})$$
$$(1\ \max(\varphi(n_1, n_2), \varphi(n_1, n_2)))$$

where $x_i(n_1)(1x_j(n_1))(1x_i(n_2))x_j(n_{21})$ can be used to determine the quantity of different component types in two 3D models, $\phi(n_1, n_2)$ is conditional probability, and can be presented as $\phi(n_1,n_2)=P(x(n)=1)$ that is the co-existent probability of two components; and step S130, the distance between vectors of two random 3D models can be obtained through step S120, a distance matrix can be obtained by calculating the distance between each two vectors of 3D models in a random model library, and the clustering of 3D models can be realized via a spectral clustering algorithm.

The learning a design knowledge prior of intra-group 3D models in step 200 includes:

step S210, obtaining an orientated bounding box (OBB) for a 3D model component, which includes the following three steps: first, obtaining an approximate convex hull for the coordinate points of the 3D model, taking a random plane on the approximate convex hull as a projection plane and projecting all the points of the model to that projection plane, calculating a 2D OBB of the projected points and stretching the 2D OBB along the plane normal direction until all the points of the model are included, which forms a candidate OBB; then, calculating the quantity of symmetric planes of respective OBBs, defining three candidate planes for any OBB i, where these candidate planes are determined by a center $C_i$ and three axial directions ($a_i^1$, $a_i^2$, $a_i^3$) of the OBB, obtaining uniform sampling points on the model surface, calculating the reflected points of the sampling points when reflected by a random candidate plane, calculating the distances from these reflected points to the model surface, if the distance is smaller than 0.0001, determining the corresponding sampling point as a symmetric point, if the percentage of the symmetric points exceeds 90%, determining the candidate plane as a symmetric plane; eventually, determining an optimal OBB which has the most symmetric planes, if a plurality of candidate OBBs contain the same quantity of symmetric planes, determining the OBB with the smallest volume as the final OBB;

step 220, extracting parameters of the component of the 3D model, given a random model, OBBs of a plurality of components can be obtained, for component j of model i, a center $C_j^i$ of the OBB, three axial directions ($a_{j,1}^i$, $a_{j,2}^i$, $a_{j,3}^i$), and the lengths ($e_{j,1}^i$, $e_{j,2}^i$, $e_{j,3}^i$) of the OBB in the respective axial directions can be obtained, these parameters are used to extract nine-dimensional parameters, for the component of model i, parameters $F_j^i=(f_{j,1}^i, f_{j,2}^i, f_{j,3}^i \ldots f_{j,9}^i)$ can be obtained, where the first three parameters represent the center of the OBB, the middle three parameters represent the projection angles between respective axial directions and the corresponding world coordinate axes, and the last three parameters represent the lengths of the OBB on the three directions, the obtained nine-dimensional parameters will be successively used in the learning of the design knowledge prior of the model, which are inputs of an intra-group design knowledge prior learning module, and are also candidate threshold values of an inter-group structure switching parameter of an inter-group design knowledge prior learning module; and step 230, learning an intra-group design knowledge prior, the intra-group design knowledge prior emphasizes on learning a deformation rule of the model while the structure thereof is preserved, in a same structure group, defining a component that all the modules contain as a common component, the total quantity of the common components is M, defining a multivariate regression coefficient matrix as $\{A^{(m)}|m=1, \ldots M\}$, where $A^{(m)}$ contains regression coefficients of all the common components, $a_i=\alpha_0, \ldots \alpha_n$ represents the i-th row of the matrix, which is computed as:

$$a_i = \operatorname*{argmin}_{a_i} \left\| b_i\ \alpha_0 \sum_{j \neq 1} \alpha_j\ b_j \right\|_2^2$$

where $b_1, \ldots b_n$ are the parameters of all the common components, by repeating the above mentioned computing process, the final regression coefficient matrix $A^m$ can be obtained;

the formula mentioned above can only solve the relationship between the common components, for a private component of the model, a relationship is constructed by establishing a linear regression equation between parameters of the private component and the common component. Taking a parameter b of the private component as an example, a parameter $\hat{b}$ of the common component which has a highest correlation coefficient with the parameter b is selected, and then unary linear regression equations $\hat{b}=\beta_1 b+\beta_0$ and $b=\hat{b}_1\hat{b}+\hat{\beta}_0$ are calculated as limit deformation equations.

The learning a structure switching rule of inter-group 3D models in step S300 includes:

step S310, determining a candidate threshold value of structure switching, given two structure groups $S_i$ and $S_j$, where the two structure groups may still contain components having the corresponding relationship (such as the seat of chair, the body of airplane etc.), then parameters of these common components can be threshold values of structure switching;

step S320, determining the final threshold value of structure switching, using an M×M matrix to represent the structure switching rule of inter-group models, the matrix can be expressed as $\{T_n^t | t=1, \ldots 9\}_{n=1}^N$, where $T_n^t$ represents the correlative value of any two structure groups with respective to the t-th parameter of the component $P_n$, $T_n^t(i, j)$ represents whether the parameter should be the threshold value between the structure groups $S_i$ and $S_j$, assuming the component $P_n$ is the common component of the structure groups $S_i$ and $S_j$, the t-th parameters of the components $P_n$ of all models in the two structure groups can be represented as $\{B_i | b_1^i, \ldots b_N^i\}$ and $\{B_j | b_1^j, \ldots b_N^j\}$, then $d(B)$ and $d(b, B)$ can be defined as:

$$d(B) = \max_{i,j}(|b_i \quad b_j|)$$

$$d(b, B) = \min_{b_j \in B}(|b \quad b_i|)$$

then the definition of $T_n^t(i, j)$ can be obtained through the above formula as:

$$T_n^t(i, j) = \begin{cases} \lambda, & \text{if } \max_{b_n^j \in B_j}(b_n^j, B_i) > \lambda, \forall i \neq j \\ \infty, & \text{ot erwise} \end{cases}$$

where $$\lambda = \frac{d(B_i) + d(B_j)}{2},$$

if $\max_{b_n^j \in B_j}(b_n^j, B_i) > \lambda$, then it is indicated that the parameter should be used as a threshold value.

The optimizing a user-edited 3D model in step S400 includes:

step S410, editing a 3D model component, where a user selects a 3D model component using a mouse, and conducts translation, rotation, scaling, deleting and adding operations to the corresponding component;

step S420, performing self-adaptive structure conversion: if the user selects the model component and operates a parameter, then setting the parameter as b, if the parameter is a threshold value of inter-group structure switching and the current structure group is $S_i$, the following formula is used to determine if the structure needs to be converted to $S_j$:

$$K(b) = \begin{cases} 1, & \text{if } (b, B_j) \leq T_n^t(i, j) \text{ and } (b, B_i) < T_n^t(i, j) \\ 0, & \text{ot erwise} \end{cases}$$

if $K(b)=1$, the structure needs to be converted from $S_i$ to $S_j$, otherwise the structure is preserved; and step S430, optimizing the component parameter of the 3D model with the structure thereof being preserved, inputting the parameters of all the common components into a trained multivariate regression module, and obtaining estimated values of respective component parameters to maintain the rationality of the model design, assuming the current structure group is $S_m$, a trained multivariate regression coefficient matrix is $A_m$, and assuming the component parameters of the current 3D model are $b=[b_1, \ldots b_n]$, if the user converts a parameter $b_c$ to $B_0$, then all the remaining component parameters can be calculated by the following formula:

$$\arg_{b_i} \min \sum_{i=1}^n \left\| b_i \left( \omega_i b_i' + (1-\omega_i) \tilde{b}_i \right) \right\|_2^2 + \omega_c \| b_c \, B_0 \|_2^2$$

wherein $\tilde{b}_i$ is the initial value of $b_i$, $b'_i$ is a multivariate regression estimated value of $b_i$, and $\omega_i$ is a multivariate regression determination coefficient, where $\omega_c \| b_c \, B_0 \|_2^2$ prevents the user-edited component parameter from being affected by a result of the multivariate regression model, $\omega_c = 10$ in the method.

The present invention provides the structure self-adaptive 3D model editing method, which has the following advantages and effects:

1. The method proposed by the invention is simple and effective, and increases the degree of automation of 3D model editing procedure by using the design knowledge priors of the 3D model library;

2. The method proposed by the invention realizes the self-adaptive change of the 3D model structure and can ensure that the model generated by editing satisfies the structural rationality;

3. The method proposed by the invention can be applied to the fields of 3D editing construction, computer-aided design and the like. By using the structure self-adaptive 3D model editing method, a large number of 3D models can be constructed quickly, thereby providing 3D materials for applications such as 3D animation production and 3D virtual scene building and so on.

DESCRIPTION OF EMBODIMENTS

The present invention will now be described in detail with reference to the accompanying drawings.

Figure 1:
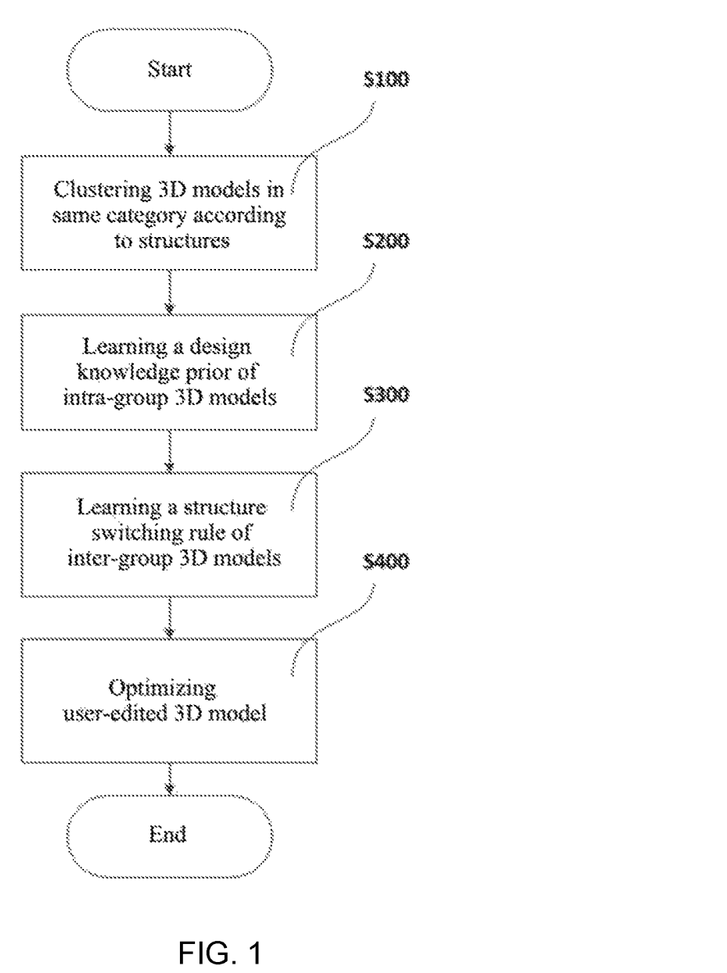
FIG. 1 is a flowchart of a structure self-adaptive 3D model editing method according to the present invention.

FIG. 1 is a flowchart of a structure self-adaptive 3D model editing method according to the present invention; there are four steps included:

step S100, clustering 3D models of a same category according to structures: inputting 3D models of the same category, for example, 3D models of tables may belong to the same category, while the 3D models of chairs may belong to the same category, clustering the 3D models into different groups according to difference in components contained in the 3D models, where structures of models in the same group are required to be as similar as possible and structures of models between different groups are required to be as different as possible;

step S200, learning a design knowledge prior of intra-group 3D models: compiling statistics of relationships between the components of models in the same group using a multivariate linear regression model according to a result of the clustering of the 3D models of the same category, to guide a 3D model editing procedure with structures thereof being preserved;

step S300, learning a structure switching rule of inter-group 3D models: analyzing geometrical parameter distribution of common components of the models in different groups according to the result of the clustering of the 3D models of the same category, and obtaining the structure switching rule of inter-group 3D models; and step S400, optimizing a user-edited 3D model: editing, by a user using an interactive tool, a size, a position, and/or an angle parameter of a component of a 3D model, adjusting the structure of the user-edited 3D model and automatically optimizing geometrical parameters of other components of the user-edited 3D model according to the learned intra-group design knowledge prior and the inter-group structure switching rule of the 3D models so that the optimized 3D model satisfies the design knowledge prior of a model library, the structure self-adaptive 3D model editing method can be used to increase the 3D model editing speed and improve the degree of automation of the model editing.

Figure 2:
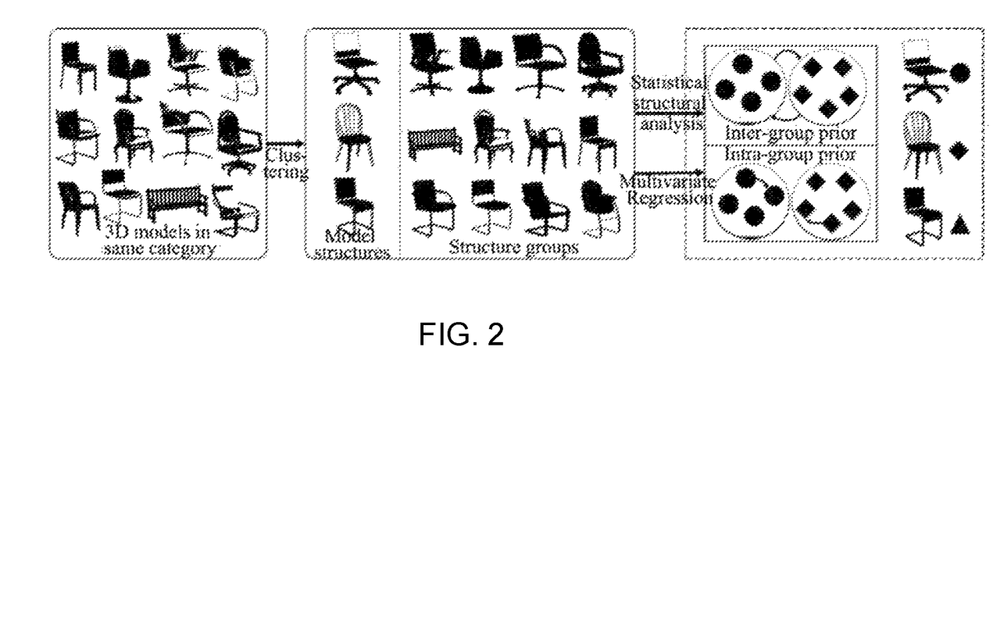
FIG. 2 is a schematic diagram of a recommendation of multi-category model combination matching functional substructures of a reference model according to the present invention.

FIG. 2 is a schematic diagram of clustering 3D models of a same category according to structures and learning a design knowledge prior of intra-group 3D models according to the present invention.

The clustering 3D models of a same category according to structures in step S100 includes:

step S110, normalizing the sizes and positions of the 3D models in the model library, and pre-dividing the models in the model library into a component level, where the method does not require a semantic corresponding relationship between components of different models, the corresponding relationship between components of different models (such as the corresponding relationship between legs of different models of chairs, the corresponding relationship between armrests of different models of chairs) is obtained automatically by clustering the components according to the position relationship between the components;

step S120, after clustering the 3D model components, determining the quantity N of the component types in the models of the same category and defining a set of the components as $\{P_1, P_2, \ldots P_N\}$, for the model $S_i$ in the 3D model library, a vector $x_i$ containing N elements can be obtained, if model $S_i$ contains a component $P_n$, then $x_i(n)=1$, otherwise, $x_i(n)=0$, given any two 3D models $S_i$ and $S_j$, vectors $x_i$ and $x_j$ can be obtained, where the distance ( ) between the two vectors can be defined as:

$$(x_i, x_j) = \sum_{(n_1 \cdot n_2)} x_i(n_1)(1\ x_j(n_1))(1\ x_i(n_2))x_j(n_{21})$$

$$(1\ \max(\varphi(n_1, n_2), \varphi(n_1, n_2)))$$

where $x_i(n_1)(1x_j(n_1))(1x_i(n_2))x_j(n_{21})$ can be used to determine the quantity of different component types in two 3D models, $\phi(n_1, n_2)$ is conditional probability, and can be presented as $\phi(n_1,n_2)=P(x(n)=1)$ that is the co-existent probability of two components; and step S130, the distance between vectors of two random 3D models can be obtained through step S120, a distance matrix can be obtained by calculating the distance between each two vectors of 3D models in a random model library, and the clustering of 3D models can be realized via a spectral clustering algorithm.

The learning a design knowledge prior of intra-group 3D models in step 200 includes:

step S210, obtaining an orientated bounding box (OBB) for a 3D model component, which includes the following three steps: first, obtaining an approximate convex hull for the coordinate points of the 3D model, taking a random plane on the approximate convex hull as a projection plane and projecting all the points of the model to that projection plane, calculating a 2D OBB of the projected points and stretching the 2D OBB along the plane normal direction until all the points of the model are included, which forms a candidate OBB, and for each component of each 3D model in a group, an OBB can be obtained; then, calculating the quantity of symmetric planes of respective OBBs, defining three candidate planes for any OBB i, where these candidate planes are determined by a center $C_i$ and three axial directions $(a_i^1, a_i^2, a_i^3)$ of the OBB, obtaining uniform sampling points on the model surface, calculating the reflected points of the sampling points when reflected by a random candidate plane, calculating the distances from these reflected points to the model surface, if the distance is smaller than 0.0001, determining the corresponding sampling point as a symmetric point, if the percentage of the symmetric points exceeds 90%, determining the candidate plane as a symmetric plane; eventually, determining an optimal OBB which has the most symmetric planes, if a plurality of candidate OBBs contain the same quantity of symmetric planes, determining the OBB with the smallest volume as the final OBB;

step 220, extracting parameters of the component of the 3D model, given a random model, OBBs of a plurality of components can be obtained, for component j of model i, a center $C_j^i$ of the OBB, three axial directions $(a_{j,1}^i, a_{j,2}^i, a_{j,3}^i)$, and the lengths $(e_{j,1}^i, e_{j,2}^i, e_{j,3}^i)$ of the OBB in the respective axial directions can be obtained, these parameters are used to extract nine-dimensional parameters, for the component of model i, parameters $F_j^i=(f_{j,1}^i, f_{j,2}^i, f_{j,3}^i \ldots f_{j,9}^i)$ can be obtained, where the first three parameters represent the center of the OBB (i.e. coordinates of the center), the middle three parameters represent the projection angles between respective axial directions and the corresponding world coordinate axes, and the last three parameters represent the lengths of the OBB on the three directions, the obtained nine-dimensional parameters will be successively used in the learning of the design knowledge prior of the model, which are inputs of an intra-group design knowledge prior learning module, and are also candidate threshold values of an inter-group structure switching parameter of an inter-group design knowledge prior learning module; and step 230, learning an intra-group design knowledge prior, the intra-group design knowledge prior emphasizes on learning a deformation rule of the model while the structure thereof is preserved, in a same structure group, defining a component that all the modules contain as a common component, the total quantity of the common components is M, defining a multivariate regression coefficient matrix as $\{A^{(m)}|m=1,\ldots M\}$, where $A^{(m)}$ contains regression coefficients of all the common components, $a_j=\alpha_0, \ldots \alpha_n$ represents the i-th row of the matrix, which is computed as:

$$a_i = \arg\min_{a_i} \left\| b_i \alpha_0 \sum_{j \neq 1} \alpha_j b_j \right\|_2^2$$

where $b_1, \ldots b_n$ are the parameters of all the common components, by repeating the above mentioned computing process, the final regression coefficient matrix $A^m$ can be obtained, and the regression coefficients thereof may be the intra-group design knowledge prior of the present invention;

the formula mentioned above can only solve the relationship between the common components, for a private component of the model, a relationship is constructed by establishing a linear regression equation between parameters of the private component and the common component. Taking a parameter b of the private component as an example, a parameter b of the common component which has a highest correlation coefficient with the parameter b is selected, and then unary linear regression equations $\hat{b}=\beta_1 b+\beta_0$ and $b=\hat{\beta}_1 \hat{b}+\hat{\beta}_0$ are calculated as limit deformation equations.

Figure 3:
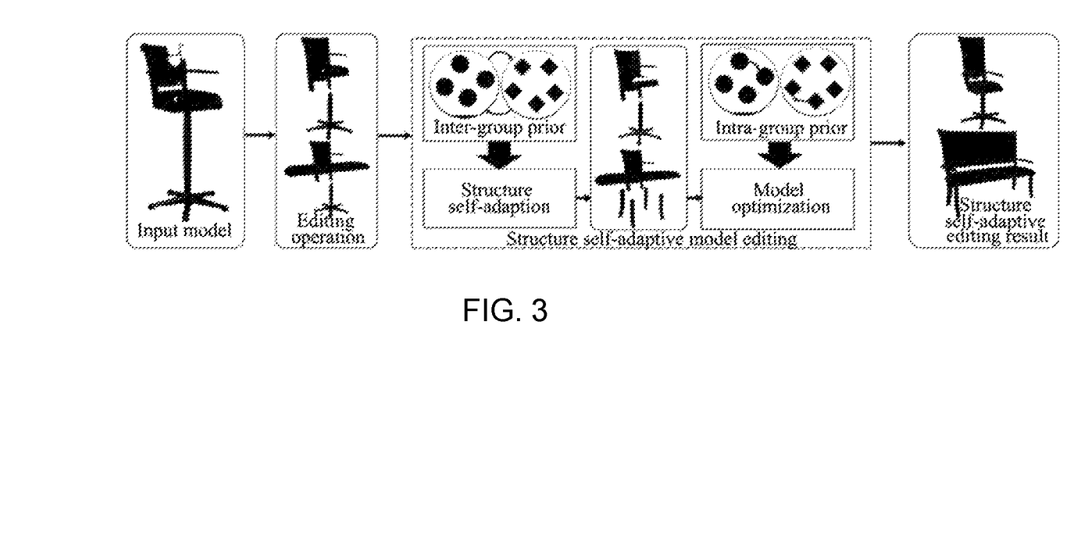
FIG. 3 is a schematic diagram of modeling of multi-category model combination guided by a reference model structure according to the present invention.

FIG. 3 is a schematic diagram of learning a structure switching rule of inter-group 3D models and optimizing a user-edited 3D model according to the present invention.

The learning a structure switching rule of inter-group 3D models in step S300 includes:

step S310, determining a candidate threshold value of structure switching, given two structure groups $S_i$ and $S_j$, where the two structure groups may still contain components having the corresponding relationship (such as the seat of chair, the body of airplane etc.), then parameters of these common components can be threshold values of structure switching;

step S320, determining the final threshold value of structure switching, using an M×M matrix to represent the structure switching rule of inter-group models, it should be appreciated that the structure switching rule of inter-group models (i.e. the threshold values of structure switching) may also be referred to as the inter-group design knowledge prior of the 3D models, the matrix can be expressed as $\{T_n^t|t=1, \ldots 9\}_{n=1}^N$, where $T_n^t$ represents the correlative value of any two structure groups with respective to the t-th parameter of the component $P_n$, $T_n^t(i, j)$ represents whether the parameter should be the threshold value between the structure groups $S_i$ and $S_j$, assuming the component $P_n$ is the common component of the structure groups $S_i$ and $S_j$, the t-th parameters of the components $P_n$ of all models in the two structure groups can be represented as $\{B_i|b_1^i, \ldots b_N^i\}$ and $\{B_j|b_1^j, \ldots b_N^j\}$, then $d(B)$ and $d(b, B)$ can be defined as:

$$d(B) = \max_{i,j}(|b_i b_j|)$$

$$d(b, B) = \min_{b_j \in B}(|b b_i|)$$

then the definition of $T_n^t(i, j)$ can be obtained through the above formula as:

$$T_n^t(i, j) = \begin{cases} \lambda, & \text{if } \max_{b_n^j \in B_j}(b_n^j, B_i) > \lambda, \forall i \neq j \\ \infty, & \text{otherwise} \end{cases}$$

where $$\lambda = \frac{d(B_i) + d(B_j)}{2},$$

if $\max_{b_n^j \in B_j}(b_n^j, B_i) > \lambda$, then it is indicated that the parameter should be used as a threshold value, and the threshold value of structure switching may be the inter-group design knowledge prior of the present invention.

The optimizing a user-edited 3D model in step S400 includes:

step S410, editing a 3D model component, where a user selects a 3D model component using a mouse, and conducts translation, rotation, scaling, deleting and adding operations to the corresponding component;

step S420, performing self-adaptive structure conversion: if the user selects the model component and operates a parameter, then setting the parameter as b, if the parameter is a threshold value of inter-group structure switching and the current structure group is $S_i$, the following formula is used to determine if the structure needs to be converted to $S_j$:

$$K(b) = \begin{cases} 1, & \text{if } (b, B_j) \leq T_n^t(i, j) \text{ and } (b, B_i) < T_n^t(i, j) \\ 0, & \text{otherwise} \end{cases}$$

if $K(b)=1$, the structure needs to be converted from $S_i$ to $S_j$, otherwise the structure is preserved; and step S430, optimizing the component parameter of the 3D model with the structure thereof being preserved, inputting the parameters of all the common components into a trained multivariate regression module, and obtaining estimated values of respective component parameters to maintain the rationality of the model design, assuming the current structure group is $S_m$, a trained multivariate regression coefficient matrix is $A_m$, and assuming the component parameters of the current 3D model are $b=[b_1, \ldots b_n]$, if the user converts a parameter $b_c$ to $B_0$, then all the remaining component parameters can be calculated by the following formula:

$$\arg_b \min \sum_{i=1}^n \left\| b_i \left( \omega_i b_i' + (1-\omega_i) \tilde{b}_i \right) \right\|_2^2 + \omega_c \| b_c B_0 \|_2^2$$

where $\tilde{b}_i$ is the initial value of $b_i$, $b'_i$ is a multivariate regression estimated value of $b_i$, and $\omega_i$ is a multivariate regression determination coefficient, where $\omega_c \| b_c B_0 \|_2^2$ prevents the user-edited component parameter from being affected by a result of the multivariate regression model, and $\omega_c=10$ in this method. For example, if the user edits a parameter of armrest of an input 3D model of chair, then parameters of all the remaining components (such as seat, back, legs of the chair) of the input 3D model of chair can be adjusted using the above formula.

The presented invention discloses a structure self-adaptive 3D model editing method that can learn structure category prior from the 3D models of different structure categories in the model library and then based on which, to support the structure self-adaptive 3D model editing; users can adjust the entire model structure and shape by editing the component parameters of the models, which improves the efficiency of model editing and 3D modeling that is suitable to be used in computer aided design.

What is claimed is:

1. A structure self-adaptive three-dimensional (3D) model editing method, comprising:
    step (S100), clustering 3D models of a same category according to structures: inputting 3D models of the same category, clustering the 3D models into different groups according to difference in components contained in the 3D models, wherein structures of models in the same group are required to be as similar as possible and structures of models between different groups are required to be as different as possible;
    step (S200), learning a design knowledge prior of intra-group 3D models: compiling statistics of relationships between the components of models in the same group using a multivariate linear regression model according to a result of the clustering of the 3D models of the same category, to guide a 3D model editing procedure with structures thereof being preserved;
    step (S300), learning a structure switching rule of inter-group 3D models: analyzing geometrical parameter distribution of common components of the models in different groups according to the result of the clustering of the 3D models of the same category, and obtaining the structure switching rule of inter-group 3D models; and
    step (S400), optimizing a user-edited 3D model: editing, by a user using an interactive tool, a size, a position, and/or an angle parameter of a component of a 3D model, adjusting a structure of the user-edited 3D model and automatically optimizing geometrical parameters of other components of the user-edited 3D model according to the learned design knowledge prior of intra-group 3D models and the learned structure switching rule of inter-group 3D models so that the optimized 3D model satisfies a design knowledge prior of a model library, the structure self-adaptive 3D model editing method is used to increase a 3D model editing speed and improve degree of automation of the model editing.

2. The method according to claim 1, wherein the clustering 3D models of a same category according to structures in step (S100) comprises:
    normalizing sizes and positions of 3D models in the model library, and pre-dividing the models in the model library into a component level, wherein the method —does not require a semantic corresponding relationship between components of different models, the corresponding relationship between components of different models is obtained automatically by clustering the components according to a position relationship between the components;
    after clustering the components of the 3D models, determining a quantity N of component types in the models of the same category and defining a set of the components as $\{P_1, P_2, \ldots, P_N\}$, for the model $S_i$ in the model library, a vector $x_i$ containing N elements is obtained, if the model $S_i$ contains a component $P_n$, then $x_i(n)=1$, otherwise, $x_i(n)=0$, given any two 3D models $S_i$ and $S_j$, vectors $x_i$ and $x_j$ are obtained, wherein a distance ( ) between the two vectors is defined as:

$$(x_i, x_j) = \sum_{(n_1 \cdot n_2)} x_i(n_1)(1\ x_j(n_1))(1\ x_i(n_2))x_j(n_{21})$$
$$(1\ \max(\varphi(n_1, n_2), \varphi(n_1, n_2)))$$

wherein $x_i(n_1)\ (1 x_j(n_1))(1 x_i(n_2))x_j(n_{21})$ is used to determine the quantity of component types in the two 3D models, $\phi(n_1, n_2)$ is conditional probability, and is presented as $\phi(n_1,n_2)=P(x(n)=1)$ that is co-existent probability of two components; and
    after obtaining the distance between vectors of two random 3D models, obtaining a distance matrix by calculating the distance between each two vectors of 3D models in a random model library, and realizing the clustering of 3D models via a spectral clustering algorithm.

3. The method according to claim 1, wherein the learning a design knowledge prior of intra-group 3D models in step (S200) comprises:
    obtaining an orientated bounding box (OBB) for a component of a 3D model, which comprises following three steps: first, obtaining an approximate convex hull for coordinate points of the 3D model, taking a random plane on the approximate convex hull as a projection plane and projecting all the points of the model to the projection plane, calculating a 2D OBB of the projected points and stretching the 2D OBB along a plane normal direction until all the points of the model are included, which forms a candidate OBB; then, calculating a quantity of symmetric planes of respective OBBs, defining three candidate planes for any OBB i, wherein these candidate planes are determined by a center $C_i$ and three axial directions $(a_i^1, a_i^2, a_i^3)$ of the OBB, obtaining uniform sampling points on a surface of the model, calculating reflected points of the sampling points when reflected by a random candidate plane, calculating distances from these reflected points to the surface of the model, if a distance is smaller than 0.0001, determining the corresponding sampling point as a symmetric point, if a percentage of the symmetric points exceeds 90%, determining the candidate plane as a symmetric plane; eventually, determining an optimal OBB which has the most symmetric planes, if a plurality of candidate OBBs contain a same quantity of symmetric planes, determining the OBB with a smallest volume as a final OBB;
    extracting parameters of the component of the 3D model, given a random model, OBBs of a plurality of components are obtained, for component j of model i, a center $C_j^i$ of the OBB, three axial directions $(a_{j,1}^i, a_{j,2}^i, a_{j,3}^i)$, and the lengths $(e_{j,1}^i, e_{j,2}^i, e_{j,3}^i)$ of the OBB in the respective axial directions are obtained, these parameters are used to extract nine-dimensional parameters, for the component of model i, parameters $F_j^i = (f_{j,1}^i, f_{j,2}^i, f_{j,3}^i \ldots f_{j,9}^i)$ are obtained, wherein first three parameters represent the center of the OBB, middle three parameters represent projection angles between the respective axial directions and corresponding world coordinate axes, and last three parameters represent lengths of the OBB on the three directions, the obtained nine-dimensional parameters are successively used in the learning of the design knowledge prior of the model, which are inputs of an intra-group design knowledge prior learning module, and are also candidate threshold values of an inter-group structure switching parameter of an inter-group design knowledge prior learning module; and
    learning an intra-group design knowledge prior, the intra-group design knowledge prior emphasizes on learning a deformation rule of the model while the structure thereof is preserved, in a same structure group, defining a component that all the modules contain as a common component, a total quantity of the common components is M, defining a multivariate regression coefficient matrix as $\{A^{(m)}|m=1,\ldots M\}$, wherein $A^{(m)}$ contains regression coefficients of all the common components, $a_i = \alpha_0, \ldots \alpha_n$ represents an i-th row of the matrix, which is computed as:

$$a_i = \arg\min_{a_i} \left\| b_i \alpha_0 \sum_{j \neq 1} \alpha_j b_j \right\|_2^2$$

wherein $b_1, \ldots b_n$ are parameters of all the common components, by repeating the above computing process, a final regression coefficient matrix $A^m$ is obtained;

the formula can only solve a relationship between the common components, for a private component of the model, a relationship is constructed by establishing a linear regression equation between parameters of a private component and the common component, for a parameter b of the private component, a parameter $\hat{b}$ of the common component which has a highest correlation coefficient with the parameter b is selected, and then unary linear regression equations $\hat{b}=\beta_1 b+\beta_0$ and $b=\hat{\beta}_1 \hat{b}+\hat{\beta}_0$ are calculated as limit deformation equations.

4. The method according to claim 1, wherein the learning a structure switching rule of inter-group 3D models in step (S300) comprises:

determining a candidate threshold value of structure switching, given two structure groups $S_i$ and $S_j$, wherein the two structure groups contain components having a corresponding relationship, then a parameter of a common component can be threshold values of structure switching; and determining a final threshold value of structure switching, using an M×M matrix to represent a structure switching rule of inter-group 3D models, the matrix is expressed as $\{T_n^t|t=1,\ldots 9\}_{n=1}^N$, wherein $T_n^t$ represents a correlative value of any two structure groups with respective to a t-th parameter of a component $P_n$, $T_n^t(i,j)$ represents whether the parameter should be the threshold value between the structure groups $S_i$ and $S_j$, assuming the component $P_n$ is the common component of the structure groups $S_i$ and $S_j$, the t-th parameters of the components $P_n$ of all the models in the two structure groups is represented as $\{B_i|b_1^i, \ldots b_N^i\}$ and $\{B_j|b_1^j, \ldots b_N^j\}$, then d(B) and d(b, B) are defined as:

$$d(B) = \max_{i,j}(|b_i\, b_j|)$$

$$d(b, B) = \min_{b_i \in B}(|b\, b_i|)$$

then a definition of $T_n^t(i, j)$ is obtained as:

$$T_n^t(i, j) = \begin{cases} \lambda, & \text{if } \max_{b_n^j \in B_j}(b_n^j, B_i) > \lambda, \forall\, i \neq j \\ \infty, & \text{otherwise} \end{cases}$$

wherein $$\lambda = \frac{d(B_i) + d(B_j)}{2},$$

if $\max_{b_n^j \in B_j}(b_n^j, B_i) > \lambda$, then the parameter is used as a threshold value.

5. The method according to claim 1, wherein the optimizing a user-edited 3D model in step (S400) comprises:

editing a component of a 3D model, wherein a user selects a component of a 3D model using a mouse, and conducts translation, rotation, scaling, deleting and adding operations to the corresponding component;

performing self-adaptive structure conversion: if the user selects the component of the model and operates a parameter, then setting the parameter as b, if the parameter is a threshold value of inter-group structure switching and a current structure group is $S_i$, the following formula is used to determine if the structure needs to be converted to $S_j$:

$$K(b) = \begin{cases} 1, & \text{if } (b, B_j) \leq T_n^t(i, j) \text{ and } (b, B_i) < T_n^t(i, j) \\ 0, & \text{otherwise} \end{cases}$$

if K(b)=1, the structure needs to be converted from $S_i$ to $S_j$, otherwise the structure is preserved; and optimizing a component parameter of a 3D model with a structure thereof being preserved, inputting parameters of all common components into a trained multivariate regression model, and obtaining estimated values of respective component parameters to maintain rationality of model design, assuming a current structure group is $S_m$, a trained multivariate regression coefficient matrix is $A_m$, and assuming the component parameters of the current 3D model are $b=[b_1, \ldots b_n]$, if the user converts a parameter $b_c$ to $B_0$, then all the remaining component parameters are calculated as:

$$\arg_b \min \sum_{i=1}^n \left\| b_i\,(\omega_i b_i' + (1-\omega_i)\tilde{b}_i) \right\|_2^2 + \omega_c \|b_c\, B_0\|_2^2$$

wherein $\tilde{b}_i$ is an initial value of $b_i$, $b_i'$ is a multivariate regression estimated value of $b_i$, and $\omega_i$ is a multivariate regression determination coefficient, wherein $\omega_c \|b_c\, B_0\|_2^2$ prevents the user-edited component parameter from being affected by a result of the multivariate regression model, where $\omega_c=10$.

* * * * *